(12) United States Patent
Kaitoh et al.

(10) Patent No.: US 8,310,611 B2
(45) Date of Patent: Nov. 13, 2012

(54) DISPLAY DEVICE AND MANUFACTURING METHOD THEREOF

(75) Inventors: Takuo Kaitoh, Mobara (JP); Toshio Miyazawa, Chiba (JP); Takeshi Sakai, Kokubunji (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 133 days.

(21) Appl. No.: 12/536,066

(22) Filed: Aug. 5, 2009

(65) Prior Publication Data

US 2010/0032680 A1  Feb. 11, 2010

(30) Foreign Application Priority Data

Aug. 7, 2008 (JP) ................................. 2008-204903

(51) Int. Cl.
  *G02F 1/136* (2006.01)
(52) U.S. Cl. ................ 349/43; 349/41; 349/42; 349/46; 349/52
(58) Field of Classification Search .................... 349/43, 349/52, 41, 42, 46, 438
  See application file for complete search history.

(56) References Cited

U.S. PATENT DOCUMENTS

| | | | | |
|---|---|---|---|---|
| 5,504,348 A | * | 4/1996 | Yoshida et al. | 257/59 |
| 5,798,744 A | * | 8/1998 | Tanaka et al. | 345/92 |
| 6,452,213 B1 | | 9/2002 | Kimura | |
| 7,567,321 B2 | * | 7/2009 | Yoon | 349/129 |
| 2005/0218409 A1 | * | 10/2005 | Um et al. | 257/72 |
| 2005/0219435 A1 | * | 10/2005 | Oh et al. | 349/43 |
| 2006/0152644 A1 | * | 7/2006 | Yi | 349/42 |
| 2007/0138469 A1 | | 6/2007 | Yoshimoto | |

FOREIGN PATENT DOCUMENTS

JP   05-055570   3/1993

* cited by examiner

*Primary Examiner* — Edward Glick
*Assistant Examiner* — Sang Nguyen
(74) *Attorney, Agent, or Firm* — Antonelli, Terry, Stout & Kraus, LLP.

(57) ABSTRACT

Provided is a display device including: a gate electrode (GT); a semiconductor film (S) which controls a current flowing between a source electrode (ST) and a drain electrode (DT), the semiconductor film including a channel region and two impurity regions formed of regions which sandwich the channel region; two Ohmic contact layers (DS) being interposed between the source electrode and the like and the two impurity regions; and an insulating film laminated on a partial region of the semiconductor film, the partial region being around a position corresponding to a substantial center of the semiconductor film, in which: the semiconductor film is formed of one of microcrystalline-silicon and polycrystalline-silicon; the two impurity regions are formed in regions on which the insulating film is absent; the two Ohmic contact layers cover the two impurity regions therewith; and the source electrode and the like cover the Ohmic contact layers therewith.

6 Claims, 9 Drawing Sheets

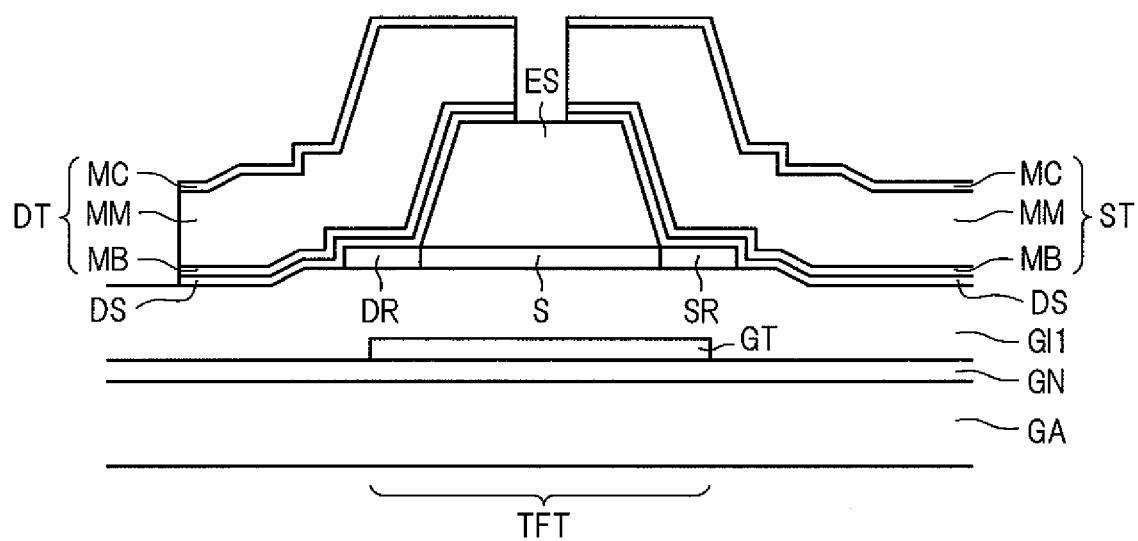

DISPLAY DEVICE AND MANUFACTURING METHOD THEREOF

CROSS-REFERENCE TO RELATED APPLICATION

The present application claims priority from Japanese application JP 2008-204903 filed on Aug. 7, 2008, the content of which is hereby incorporated by reference into this application.

BACKGROUND OF THE INVENTION

1. Field of the Invention

The present invention relates to a display device which performs display control on pixels by using a thin-film transistor (TFT), and a manufacturing method of the display device.

2. Description of the Related Art

Heretofore, studies have been made to improve electric characteristics or the like of a thin-film transistor formed with amorphous silicon (a-Si) so as to achieve higher performance thereof. Here, in order to attain desired electric characteristics in a thin-film transistor formed with amorphous silicon, studies have also been made in a direction that the mobility of electrons are increased by increasing a grain size of the silicon, without changing to the extent possible the structure of the thin-film transistor formed with amorphous silicon so that a designed manufacturing process can still be employed.

JP 05-55570 A discloses an example of the above-mentioned technology, and FIG. 6 is a diagram illustrating a thin-film transistor with a bottom-gate structure similar to that disclosed in JP 05-55570 A. According to JP 05-55570 A, as illustrated in the drawing, a polycrystalline silicon (p-Si) layer is laminated below an amorphous silicon layer, due to the manufacturing of the display device.

In the case of the thin-film transistor illustrated in FIG. 6, an on-state current flows through the polycrystalline silicon layer SP of high electron mobility. On the other hand, there arises a problem when an off-state current flows therethrough. When a negative voltage is applied to a gate electrode GT, positive holes are induced to the polycrystalline silicon layer SP and a current due to the positive holes directly flows into a drain electrode DT and a source electrode ST because there is provided no potential barrier between the polycrystalline silicon layer SP and each of the drain electrode DT and the source electrode ST.

In order to solve the problem, the inventors of the present invention have first studied a structure illustrated in FIG. 7. As illustrated in FIG. 7, a polycrystalline silicon layer SP and an amorphous silicon layer SA are each covered with an impurity silicon layer (Doped-Si) DS formed of amorphous silicon doped with an impurity, to thereby prevent the passage of positive holes, with the result that an off-state current is suppressed. However, the polycrystalline silicon layer SP is connected to the drain electrode DT and to the source electrode ST through the impurity silicon layer DS with a small contact area, which increases contact resistance, leading to an insufficient on-state current.

With this being the situation, the inventors of the present invention have further studied a structure illustrated in FIG. 8. In order to increase the on-state current in the structure of FIG. 7, an area across which the semiconductor film S is connected to the drain electrode DT and to the source electrode ST is increased as illustrated in FIG. 8, to thereby reduce the contact resistance. To attain this structure, an insulating film ES is first formed in place of the amorphous silicon layer SA, so that the semiconductor film S contacts with the impurity silicon layer DS at portions not covered with the insulating film ES.

However, with the structure illustrated in FIG. 8, as can be understood from the graph of FIG. 9A which illustrates the volt-ampere characteristics between the gate voltage and the drain current, a sufficient on-state current is secured at a drain voltage of 1V while suppressing the off-state current, whereas at a drain voltage of 10V, the off-state current cannot be suppressed and allows a leak current to flow. Accordingly, a drain voltage to be applied to the thin-film transistor needs to be limited to, for example, 5V or less, and there still remains a problem of how to suppress the off-state current in a case of increasing the drain voltage to a higher voltage.

SUMMARY OF THE INVENTION

The present invention has an object to provide a display device provided with a thin-film transistor in which an on-state current and an off-state current are optimized without increasing a manufacturing process to suppress an increase in cost, and a manufacturing method of the display device.

In order to solve the above-described problems, the present invention provides a display device including: a gate electrode laminated above a transparent substrate; a semiconductor film which is laminated above the gate electrode and controls, due to an electric field generated by the gate electrode, a current flowing between a source electrode and a drain electrode, the semiconductor film including a channel region and two impurity regions formed of regions which are doped with an impurity and sandwich the channel region; two Ohmic contact layers each being interposed between the source electrode and one of the two impurity regions and between the drain electrode and another one of the two impurity regions, for bringing the source electrode and the drain electrode into Ohmic contact with each of the two impurity regions; and an insulating film laminated on a partial region of the semiconductor film, the partial region being around a position corresponding to a substantial center of the semiconductor film, the insulating film being in contact with the semiconductor film, in which: the semiconductor film is formed of one of microcrystalline silicon and polycrystalline silicon; the two impurity regions are formed in the semiconductor film in regions on which the insulating film is absent; the two Ohmic contact layers are formed so that the two impurity regions are covered therewith; and the source electrode and the drain electrode are formed so that the two Ohmic contact layers are covered therewith. With this structure, in a case of using a semiconductor film formed of microcrystalline silicon or polycrystalline silicon, an impurity region is provided to form a PN junction to thereby suppress an off-state current, while the impurity region is covered with an Ohmic contact layer which allows the impurity region to contact with a drain electrode or the like in a wider area, to thereby secure a sufficient on-state current.

Further, in the display device described above, the two impurity regions are partially formed into shapes corresponding to shapes of the source electrode and the drain electrode; and the two Ohmic contact layers each extend from a part of the insulating film so that the two Ohmic contact layers each cover an upper surface and a side surface of each of the two impurity regions, and are formed into shapes corresponding to the shapes of the source electrode and the drain electrode. With this structure, the Ohmic contact layer and the impurity region are formed with efficiency, whereby the off-state current is suppressed while the on-state current is secured.

In order to solve the above-described problems, the present invention also provides a manufacturing method of a display device including the steps of: laminating a gate electrode above a transparent substrate; laminating, above the gate electrode, a semiconductor film which is formed one of microcrystalline silicon and polycrystalline silicon and controls, due to an electric field generated by the gate electrode, a current flowing between a source electrode and a drain electrode; doping in partial regions of the semiconductor film with an impurity; and forming the source electrode and the drain electrode, while forming two Ohmic contact layers interposed between the source electrode and one of the partial regions of the semiconductor film doped with an impurity and between the drain electrode and another one of the partial regions of the semiconductor film doped with an impurity, so that the source electrode and the drain electrode are brought into Ohmic contact with each of the partial regions of the semiconductor film.

Further, in the manufacturing method of a display device described above, the step of doping in partial regions of the semiconductor film with an impurity includes the steps of: laminating an insulating film which covers the semiconductor film; processing the insulating film by forming a resist pattern on the insulating film and subjecting the insulating film to side etching so that the insulating film is formed inside the resist pattern; and processing the semiconductor film through dry etching according to the resist pattern, the semiconductor film being doped with the impurity by using, as a mask, the insulating film formed inside the resist pattern. Accordingly, the semiconductor film may be doped with the impurity with efficiency. At this time, the step of forming the source electrode and the drain electrode includes the steps of: depositing a film for forming the Ohmic contact layer, the film being formed of amorphous silicon and an impurity; depositing, on the film for forming the Ohmic contact layer, a metal for forming the source electrode and the drain electrode; processing the metal deposited in the step of depositing, on the film for forming the Ohmic contact layer, a metal for forming the source electrode and the drain electrode into shapes corresponding to shapes of the source electrode and the drain electrode; and forming two Ohmic contact layers, by processing the film for forming the Ohmic contact layer into shapes corresponding to the shapes of the source electrode and the drain electrode, by using the insulating film as an etching stopper, the manufacturing method of a display device further including a step of processing the partial regions formed in the semiconductor film into two separated impurity regions in accordance with the shapes of the source electrode and the drain electrode by using the insulating film as an etching stopper, the partial regions being doped with an impurity, by continuing the processing in the step of forming the two Ohmic contact layers. Accordingly, the Ohmic contact layers and the impurity region may be formed with efficiency in accordance with the shapes of the source electrode and the drain electrode.

BRIEF DESCRIPTION OF THE DRAWINGS

In the accompanying drawings:

FIG. 3 is a cross-sectional diagram taken along the line III-III of FIG. 2;

DETAILED DESCRIPTION OF THE INVENTION

Hereinafter, an embodiment of the present invention is described with reference to the accompanying drawings.

A display device according to an embodiment of the present invention includes a liquid crystal display device employing in-plane switching (IPS) system. The liquid crystal display device includes a TFT substrate which has a gate signal line, a drain signal line, a thin-film transistor, a pixel electrode, and a counter electrode disposed thereon, a filter substrate which opposes to the TFT substrate and is provided with a color filter, and a liquid crystal material enclosed in a region sandwiched by the TFT substrate and the filter substrate. The TFT substrate is formed by disposing a thin-film transistor or the like on a transparent substrate such as a glass substrate.

Figure 1:
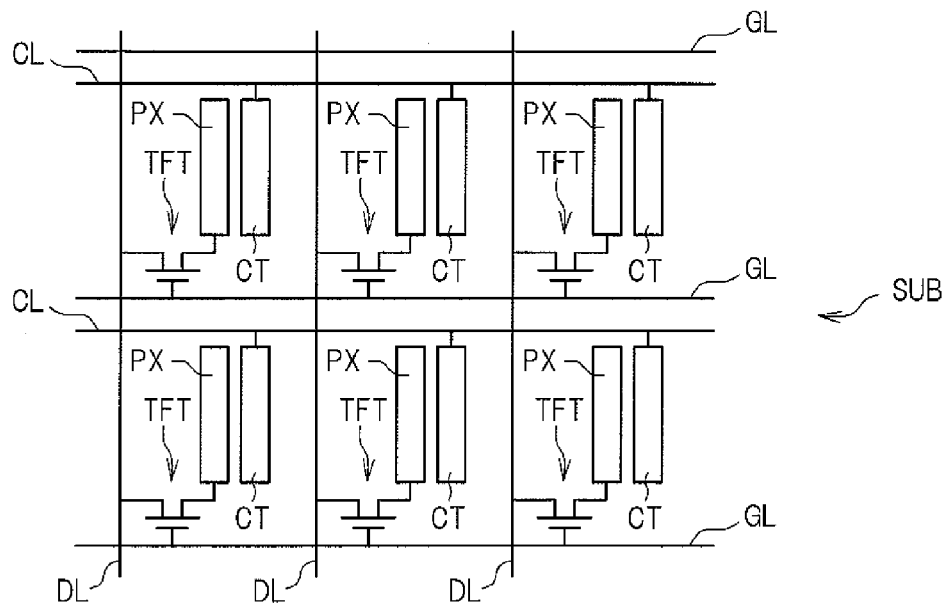
FIG. 1 is an equivalent circuit diagram of a TFT substrate forming a liquid crystal display device employing IPS system.
Figure 2:
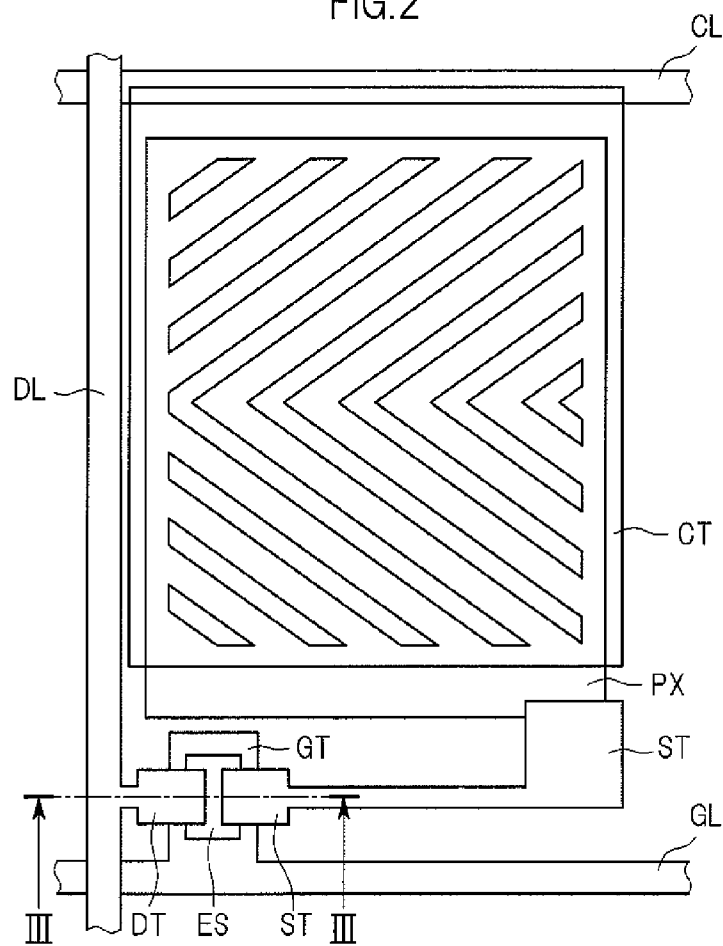
FIG. 2 is an enlarged plan view illustrating a pixel region of the TFT substrate according to an embodiment of the present invention.

FIG. 1 is an equivalent circuit diagram of the TFT substrate SUB of the liquid crystal display device. Further, FIG. 2 is an enlarged plan view of one of the pixel regions of the TFT substrate SUB.

In the drawings, the TFT substrate SUB is provided with a number of gate signal lines GL extending in the lateral direction of the drawings at regular intervals and a number of drain signal lines DL extending in the longitudinal direction of the drawings at regular intervals. The gate signal lines GL and the drain signal lines DL define sections of pixels aligned in a grid pattern. Further, the TFT substrate SUB is also provided with common signal lines CL extending in the lateral direction of the drawings in parallel with the respective gate signal lines GL.

In each corner of the pixel regions defined by the gate signal lines GL and the drain signal lines DL, a thin-film transistor TFT with a metal-insulator-semiconductor (MIS) structure is formed. The thin-film transistor TFT has a gate electrode GT connected to one of the gate signal lines GL and a drain electrode DT connected to one of the drain signal lines DL. Further, in each of the pixel regions, a pixel electrode PX and a counter electrode CT are formed in a pair. The pixel electrode PX is connected to a source electrode ST of the thin-film transistor TFT, and the counter electrode CT is connected to one of the common signal lines CL.

In the above-mentioned circuit structure, a reference voltage is applied to the counter electrode CT of each of the pixels through each of the common signal lines CL, and a gate voltage is applied to each of the gate signal lines GL, to thereby select a pixel row. Further, upon selecting the pixel row, a video signal is supplied to each of the drain signal lines DL, whereby a voltage of the video signal is applied to the pixel electrode PX of each pixel. As a result, a lateral electric field having strength corresponding to the voltage of the video signal is generated between the pixel electrode PX and the counter electrode CT, and the strength of the lateral electric field determines the orientation of liquid crystal molecules.

Here, as illustrated in FIG. 2, an insulating film ES is formed above the gate electrode GT connected to one of the gate signal lines GL, and further the drain electrode DT and the source electrode ST are formed so as to overlap in part with the insulating film ES.

FIG. 3 is a diagram illustrating a cross-section taken along the line III-III of FIG. 2, which is a cross-section perpendicular to the direction in which the drain signal line DL extends. As illustrated in the drawing, in the thin-film transistor TFT formed on the TFT substrate SUB, a semiconductor film S is formed above the gate electrode GT through a gate insulating film GI1. The insulating film ES is formed on the semiconductor film S so as to be in contact with the semiconductor film S. Formed on both sides of the insulating film ES are the drain electrode DT and the source electrode ST. Further, the semiconductor film S is doped with an impurity at both ends thereof, whereby a drain region DR and a source region SR (hereinafter, referred to as two impurity regions) are formed. The two impurity regions each are connected to the drain electrode DT and the source electrode ST, respectively, so as to be in Ohmic contact therewith, through an impurity silicon layer DS (hereinafter, referred to as Ohmic contact layer DS). The Ohmic contact layer DS is formed of amorphous silicon deposited while being doped with an impurity. It should be noted that the Ohmic contact refers to a contact in an electrical contact portion between, for example, a wiring layer and a semiconductor layer, in which the voltage-ampere characteristic exhibits linearity.

Here, the semiconductor film S is formed of amorphous silicon which deposited through CVD or the like and is subjected to laser annealing or the like to be crystallized into crystalline silicon such as microcrystalline silicon (μc-Si) or polycrystalline silicon. In general, as the crystallinity of the silicon forming the semiconductor film S improves, the mobility of electrons in the semiconductor film S increases because the crystal size increases. However, the process temperature is also required to be high, which leads to an increase in process cost.

The semiconductor film S according to the embodiment of the present invention is formed by including microcrystalline silicon or polycrystalline silicon.

It should be noted that the crystal grain size of the microcrystalline silicon falls approximately within the range of 10 nm to 100 nm. The crystal grain size in the semiconductor film S can be identified by reflection electron diffraction or Raman spectrometric method.

Then, the semiconductor film S is doped on both sides with an N-type impurity such as phosphorus (P) using the insulating film ES as a mask, whereby the two impurity regions are formed. In the semiconductor film S, the region below the insulating film ES is sandwiched between the two impurity regions and serves as a channel region for controlling, due to an electric field generated by the gate electrode GT, the current flowing between the drain electrode DT and the source electrode ST.

Further, the Ohmic contact layer DS is formed in two separated regions, so that the drain electrode DT and the source electrode ST are brought into Ohmic contact with the two impurity regions, respectively. The Ohmic contact layer DS is formed of a material conforming to the material forming the drain electrode DT and the source electrode ST so as to cover the two impurity regions. The drain electrode DT and the source electrode ST are formed mainly of aluminum, and hence the Ohmic contact layer DS in this embodiment is formed of amorphous silicon doped with an impurity such as phosphorus. As illustrated in FIG. 3, the Ohmic contact layer DS formed in two separate regions is provided so as to extend across the insulating film ES in part and one of the drain region DR and the source region SR. The two impurity regions are also doped with an impurity such as phosphorus, however, the Ohmic contact layer DS is higher in impurity concentration than the two impurity regions and formed of amorphous silicon unlike the two impurity regions.

The insulating film ES is formed of silicon dioxide ($SiO_2$) or the like by CVD. As described later, the insulating film ES serves as a mask when doping the two impurity regions with an impurity and also serves the purpose of protecting the semiconductor film S from being etched when forming the Ohmic contact layer DS through etching by using the drain electrode DT or the like as a mask.

The drain electrode DT and the source electrode ST are formed mainly of a metal such as aluminum and formed so as to cover the Ohmic contact layer DS formed in two separate regions, respectively. With this structure, the impurity silicon layer DS is interposed between the drain electrode DT and the drain region DR and between the source electrode ST and the source region SR.

Figure 9A:
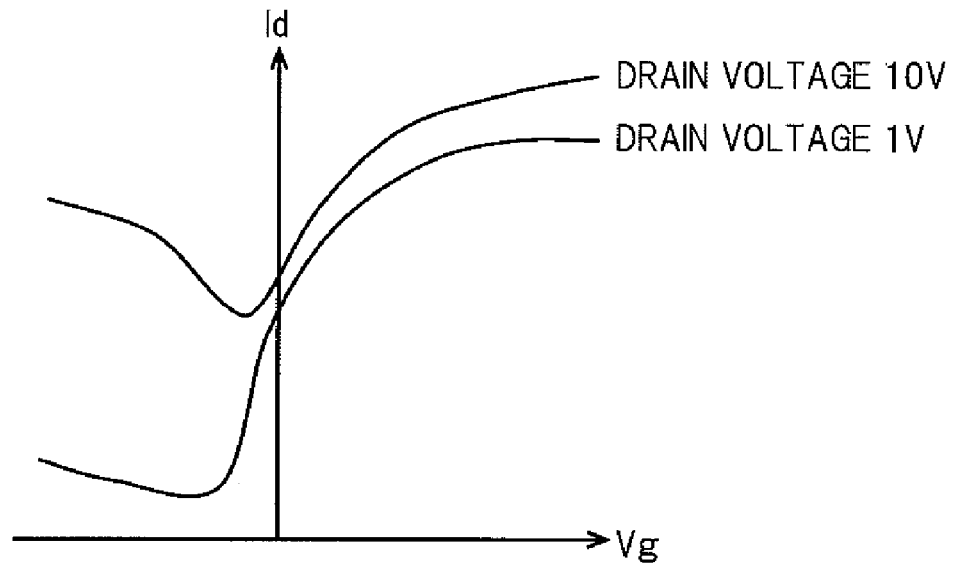
FIG. 9A is a graph illustrating the volt-ampere characteristics between the gate voltage and the drain current in the thin-film transistor of FIG. 8.
Figure 9B:
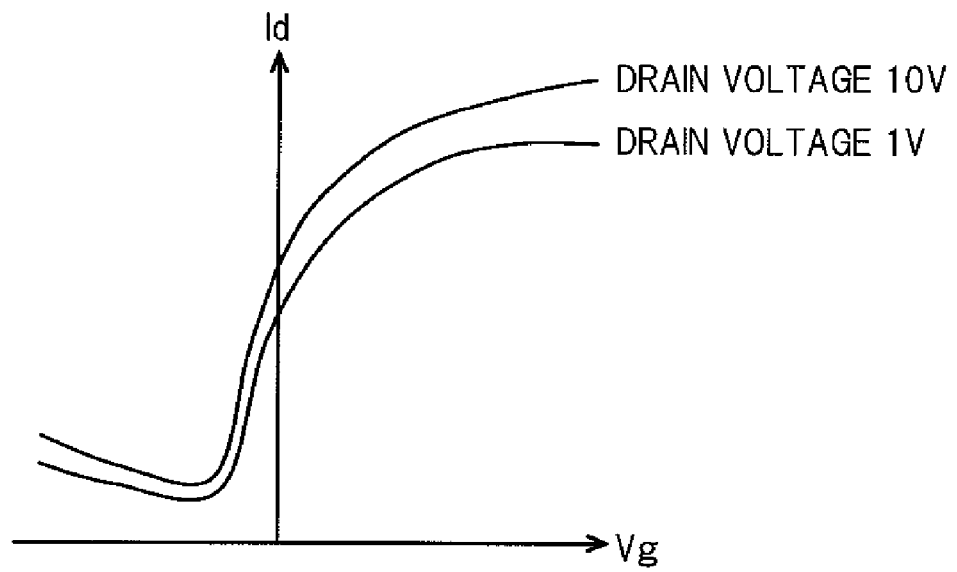
FIG. 9B is a graph illustrating the volt-ampere characteristics between the gate voltage and the drain current in the thin-film transistor of FIG. 3.

As described above, an area across which the two impurity regions are each connected to the drain electrode DT and the source electrode ST, respectively, through the Ohmic contact layer DS formed in two regions is increased, which reduces the contact resistance, to thereby secure an on-state current. Then, each of the two impurity regions and a portion of the semiconductor film S below the insulating film ES, the portion serving as a channel region, form PN junctions therebetween. With this structure, in a case where no gate voltage is applied, depletion regions are formed at interfaces between the channel region and each of the two impurity regions, which prevents a leak current from flowing between the drain electrode DT and the source electrode ST even in a case where a higher voltage is applied (FIG. 9B).

In the above, a description is given of the thin-film transistor TFT on the TFT substrate SUB according to the embodiment of the present invention. In the following, a method of manufacturing the thin-film transistor TFT is described with reference to FIGS. 4A to 4J, and FIGS. 5A to 5C.

Figure 4A:
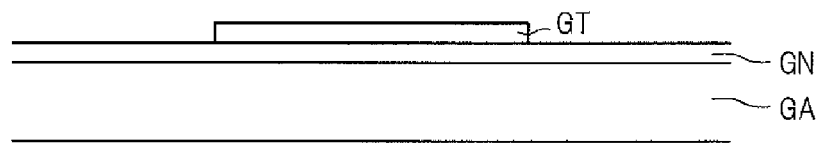
FIG. 4A is a diagram illustrating how to manufacture the thin-film transistor TFT applicable to the display device according to the embodiment of the present invention.

First, on a transparent substrate GA such as a glass substrate, a pollution protective film GN is deposited, on which the gate electrode GT is formed (FIG. 4A). The contamination protective film GN is formed of silicon nitride (SiN) deposited by, for example, CVD. Further, the gate electrode GT is formed of a conductive metal such as molybdenum, and subjected to a known lithography process and a known etching process to be processed so as to be in a shape as illustrated in the drawing.

Figure 4B:
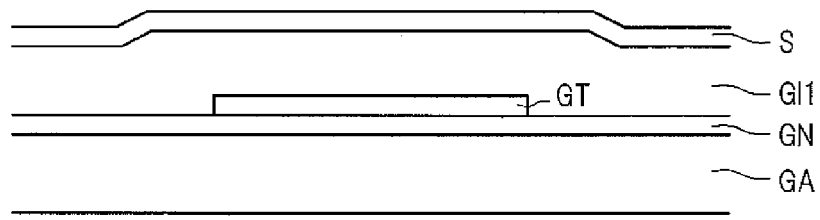
FIG. 4B is a diagram illustrating how to manufacture the thin-film transistor TFT applicable to the display device according to the embodiment of the present invention.

Next, the gate insulating film GI1 is formed so as to cover the gate electrode GT, and the semiconductor film S is formed on the gate insulating film GI1 (FIG. 4B). The gate insulating film GI1 is formed of, for example, silicon nitride, which is deposited by CVD. To form the semiconductor film S, amorphous silicon is first deposited through CVD, and then the amorphous silicon is subjected to laser annealing or rapid thermal annealing (RTA) to be crystallized into polycrystalline silicon. At this time, the amorphous silicon may be subjected to thermal processing to be crystallized into microcrystalline silicon.

Figure 4C:
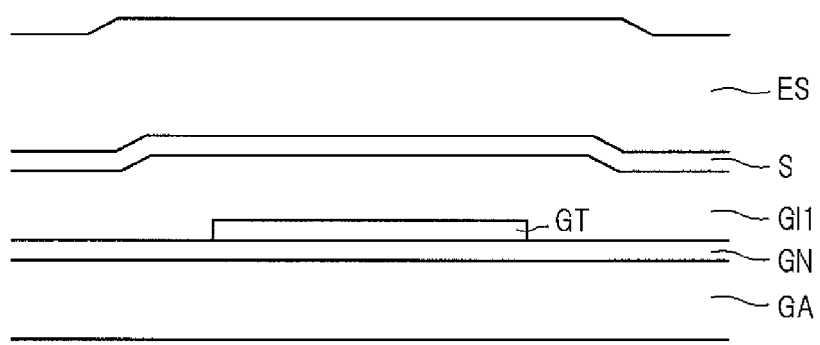
FIG. 4C is a diagram illustrating how to manufacture the thin-film transistor TFT applicable to the display device according to the embodiment of the present invention.

Next, on the semiconductor film S thus crystallized, silicon dioxide is deposited by CVD to be laminated as the insulating film ES (FIG. 4C).

Figure 4D:
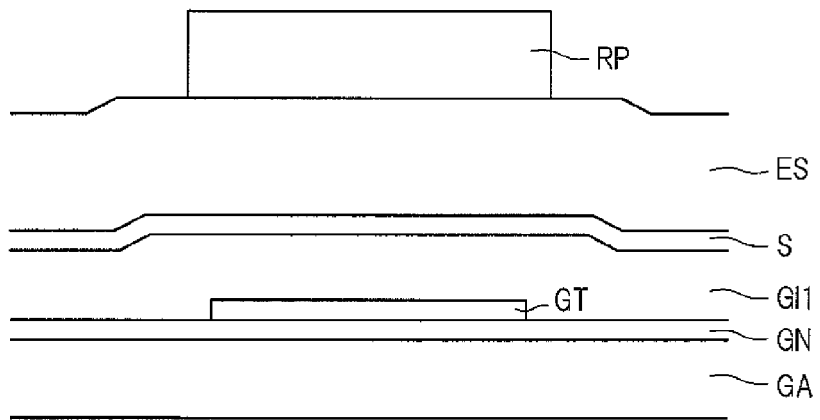
FIG. 4D is a diagram illustrating how to manufacture the thin-film transistor TFT applicable to the display device according to the embodiment of the present invention.

Then, on the insulating film ES, a resist pattern RP is formed through a known lithography process (FIG. 4D). In the known lithography process, a photoresist is first applied onto the above-mentioned insulating film ES, and further the photoresist is irradiated with an ultraviolet light or the like through a photomask having a predetermined pattern formed thereon. Due to a pattern corresponding to the pattern on the photomask transferred onto the photoresist, the photoresist is partially irradiated with an ultraviolet light to be subjected to a chemical reaction by the irradiation, except for the portions covered with the pattern. Then, the photoresist undergoes a development process, in which the photoresist is removed in part where the chemical reaction has occurred or in part where the chemical reaction has not occurred, whereby the resist pattern RP is formed. The resist pattern RP according to this embodiment is formed in a shape according to which the semiconductor film S is to be processed.

Figure 4E:
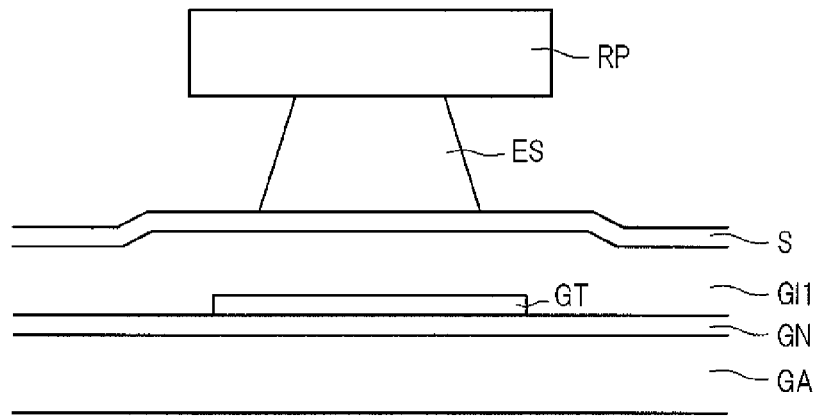
FIG. 4E is a diagram illustrating how to manufacture the thin-film transistor TFT applicable to the display device according to the embodiment of the present invention.
Figure 4F:
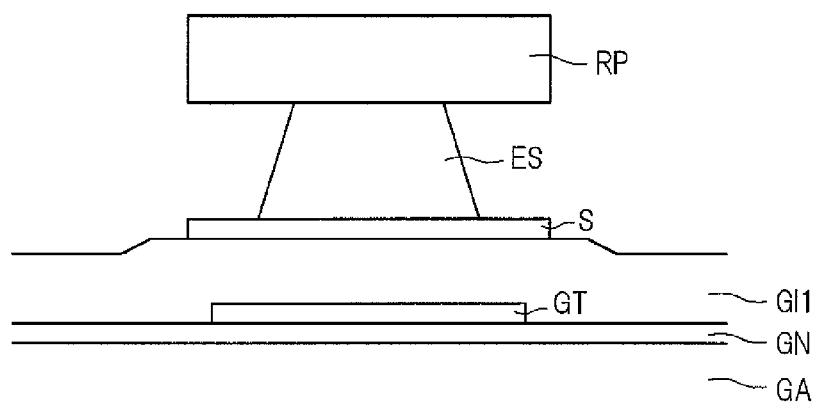
FIG. 4F is a diagram illustrating how to manufacture the thin-film transistor TFT applicable to the display device according to the embodiment of the present invention.

Then, in particular, using the resist pattern RP as a mask, the laminated insulating film ES is processed by wet etching with hydrofluoric acid-based etchant (FIG. 4E). At this time, the insulating film ES is side etched, so that the insulating film ES is formed inside the resist pattern RP. After the insulating film ES is processed by wet etching, the semiconductor film S is subjected to dry etching according to the resist pattern RP, to thereby process the semiconductor film S into a shape similar to the shape of the resist pattern RP (FIG. 4F). The insulating film ES is substantially equally eroded inwardly from the exterior edge of the resist pattern RP to be formed into a tapered trapezoidal shape in cross-section of the insulating film ES as illustrated in FIG. 4F or the like. On the other hand, the semiconductor film S is formed into a shape substantially similar to the shape of the resist pattern RP. Accordingly, the insulating film ES contacts with an upper side of the semiconductor film S and is formed in a region around a position corresponding to the substantial center of the semiconductor film S.

Figure 4G:
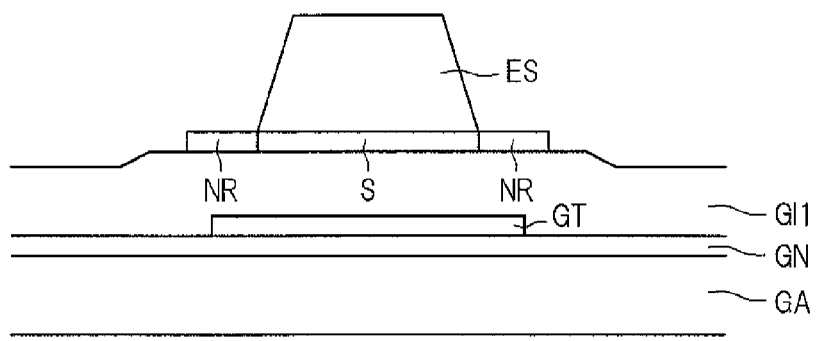
FIG. 4G is a diagram illustrating how to manufacture the thin-film transistor TFT applicable to the display device according to the embodiment of the present invention.
Figure 5A:
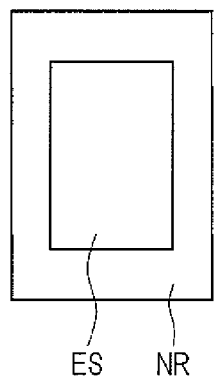
FIG. 5A is a top view illustrating how to manufacture the thin-film transistor TFT according to the embodiment of the present invention.

After that, the resist pattern RP is removed by ashing with oxygen plasma or the like, and the semiconductor film S is doped with an N-type impurity such as phosphorus (P) (FIG. 4G). The impurity is ionized by an ion implanter to be field-accelerated, so as to be uniformly doped into a plane of the TFT substrate to be processed, from a direction substantially vertical to the TFT substrate. Specifically, according to this embodiment, the insulating film ES formed by wet etching as illustrated in FIG. 4F serves as a mask, with the result that the semiconductor film S is doped with the impurity in a region NR on which the insulating film ES is not formed. Further, the semiconductor film S is not doped with the impurity in a region below the insulating film ES, and the region is formed of polycrystalline silicon or microcrystalline silicon. Here, FIG. 5A is a top view illustrating how the respective layers of FIG. 4G are processed. As illustrated in FIG. 5A, the region NR, which is formed by doping an impurity in the semiconductor film S, is formed around the insulating film ES.

Figure 4H:
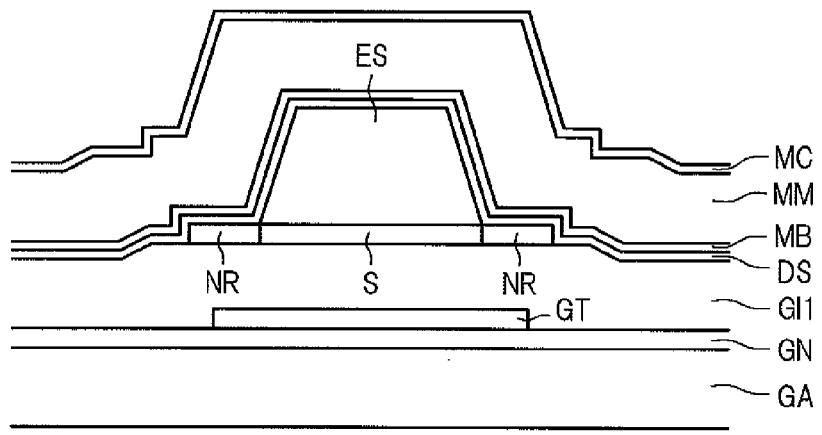
FIG. 4H is a diagram illustrating how to manufacture the thin-film transistor TFT applicable to the display device according to the embodiment of the present invention.

After an impurity is doped into the semiconductor film S, the Ohmic contact layer DS is formed and a metal film for forming the drain electrode DS and the source electrode ST are deposited (FIG. 4H). First, the Ohmic contact layer DS is formed by, for example, depositing amorphous silicon together with an impurity such as phosphorus, by PECVD. The Ohmic contact layer DS in this embodiment is formed to have an impurity concentration higher than that of the region NR formed in the semiconductor film S described above. The drain electrode DT and the source electrode DT are respectively formed of a barrier metal layer MB, a main wiring layer MM, and a cap metal layer MC, which are deposited through spattering. At this time, the barrier metal layer MB and the cap metal layer MC are each formed of a conductive metal thin film having a high melting point, such as titanium, tungsten, chromium, or molybdenum. The main wiring layer MM is formed of aluminum or an alloyed metal including aluminum. An Ohmic contact of good quality is provided between aluminum or an alloyed metal including aluminum and amorphous silicon deposited together with an impurity.

Figure 4I:
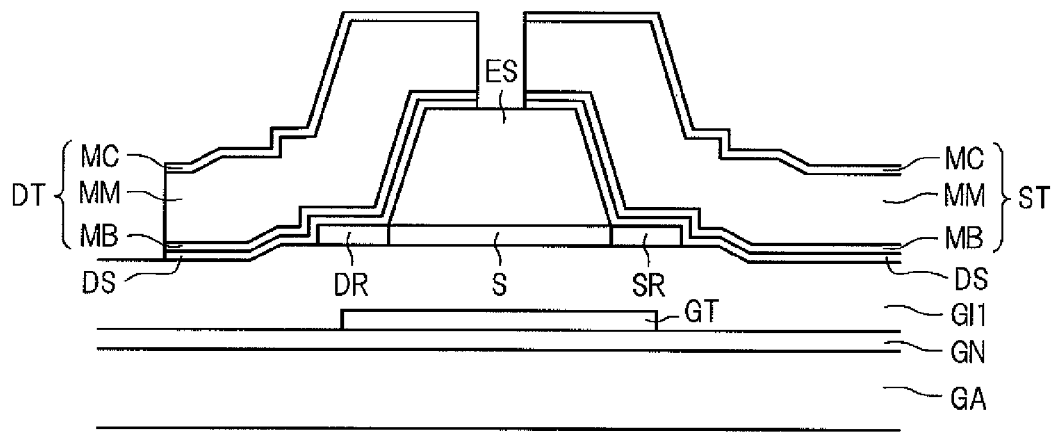
FIG. 4I is a diagram illustrating how to manufacture the thin-film transistor TFT applicable to the display device according to the embodiment of the present invention.
Figure 4J:
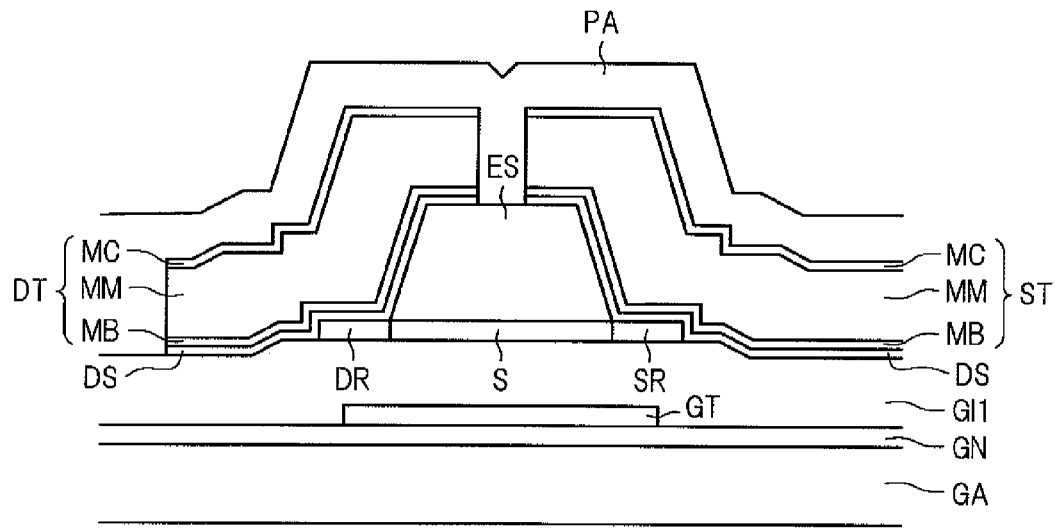
FIG. 4J is a diagram illustrating how to manufacture the thin-film transistor TFT applicable to the display device according to the embodiment of the present invention.
Figure 5B:
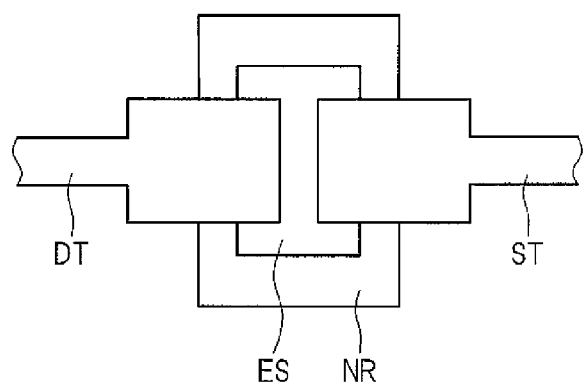
FIG. 5B is a top view illustrating how to manufacture the thin-film transistor TFT according to the embodiment of the present invention.

Then, the cap metal layer MC, the main wiring layer MM, the barrier metal layer MB, and the Ohmic contact layer DS are formed into the shapes of the drain electrode DT and the source electrode ST through a known lithography process and a known etching process (FIG. 4I). The drain electrode DT and the source electrode ST according to this embodiment are each formed of three layers including the cap metal layer MC, the main wiring layer MM, and the barrier metal layer MB. Here, FIGS. 5B and 5C each are a top view illustrating how the respective layers of FIG. 4I are processed. First, a resist pattern for forming the drain electrode DT and the source electrode ST is formed on the cap metal layer MC. Then, the cap metal layer MC, the main wiring layer MM, and the barrier metal layer MB are subjected to wet etching according to the resist pattern, whereby the drain electrode DT and the source electrode ST are formed (FIG. 5B). (In the FIG. 5B, the Ohmic contact layer DS is not shown.) Next, the Ohmic contact layer DS is dry etched by using, as a mask, the drain electrode DT and the source electrode DT thus formed, so that the Ohmic contact layer DS is formed into a shape similar to each of the shapes of the drain electrode DT and the source electrode ST. As a result, the Ohmic contact layer DS is formed as being covered with the drain electrode DT or the like from above (FIG. 5B).

Figure 5C:
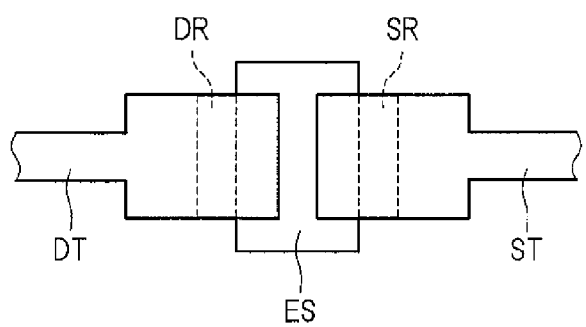
FIG. 5C is a top view illustrating how to manufacture the thin-film transistor TFT according to the embodiment of the present invention.
Figure 6:
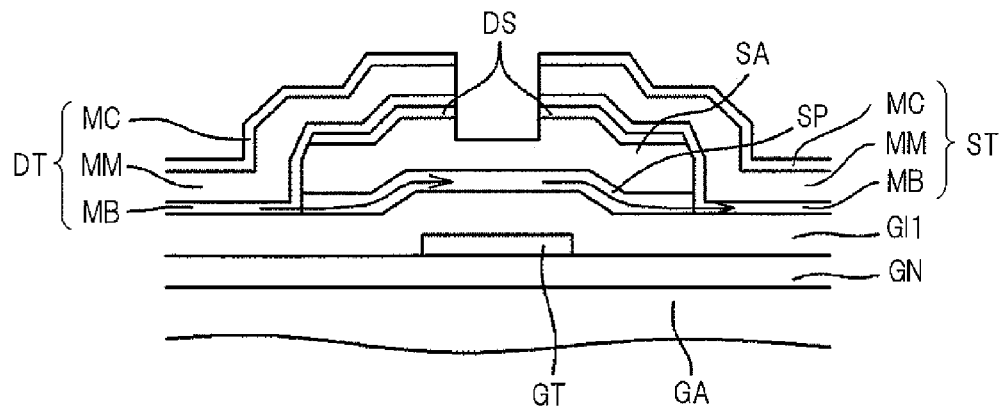
FIG. 6 is a diagram illustrating a thin-film transistor with a bottom-gate structure, which is similar to the thin-film transistor disclosed in JP 05-55570 A.
Figure 7:
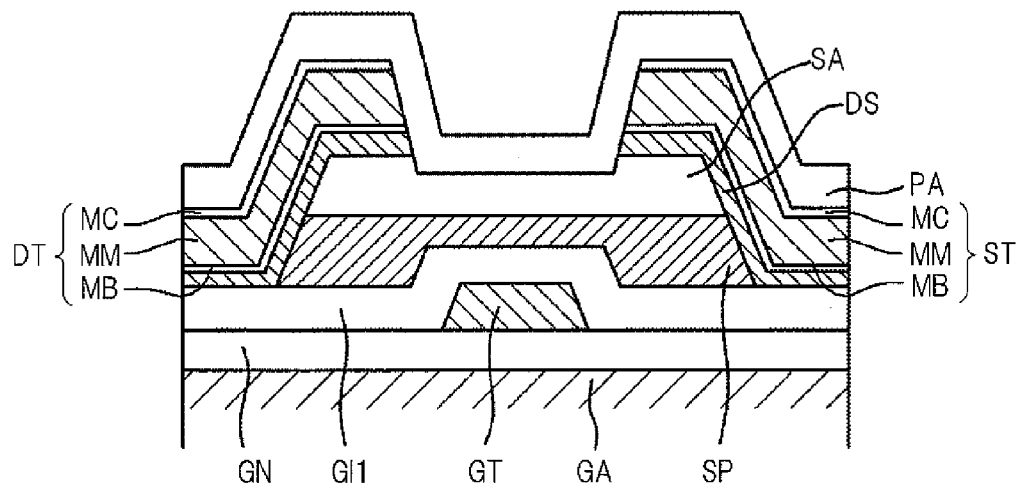
FIG. 7 is a diagram illustrating a structure studied by the inventors of the present invention, with respect to the structure of the thin-film transistor of FIG. 6.
Figure 8:
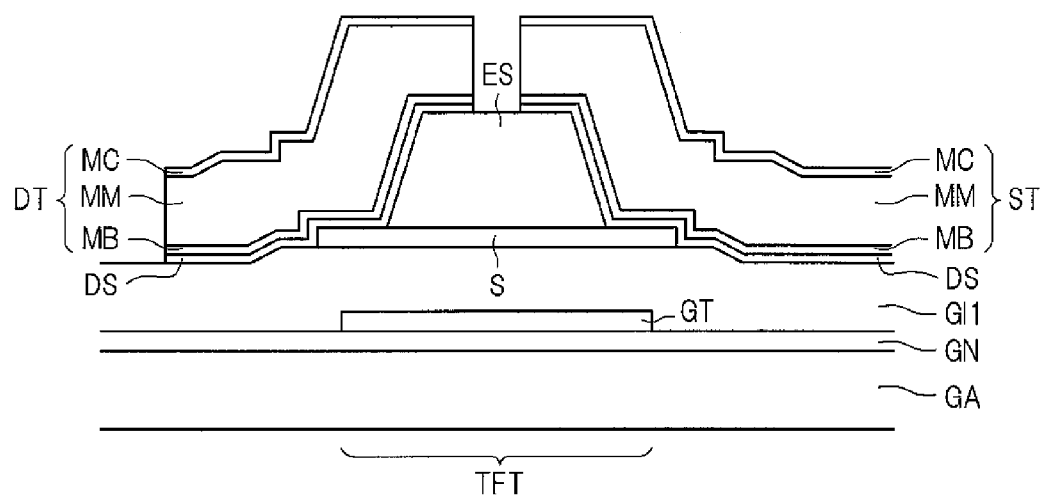
FIG. 8 is a diagram illustrating another structure studied by the inventors of the present invention, with respect to the structure of the thin-film transistor of FIG. 7.

Then, the dry etching for processing the Ohmic contact layer DS is further continued so as to process the region NR in the semiconductor layer S, the region NR being exposed out of the insulating film ES to be doped with an impurity, to thereby form the two impurity regions (drain region DR and source region SR) (FIG. 5C). The Ohmic contact layer DS is subjected to dry etching, whereby the region NR is exposed in part. In this embodiment, the region NR and the Ohmic contact layer DS can be processed in the same dry etching process because both are formed of silicon doped with phosphorus. At this time, the insulating film ES serves as an etching stopper to protect the insulating film S from the dry etching. As illustrated in FIG. 5C, the region NR is formed in accordance with the shapes of the drain electrode DT and the source electrode ST, so that the two impurity regions have the side surfaces located in the upper part and the lower part of the drawing formed along with the processed shapes of the drain electrode DT and the source electrode ST. There are provided two Ohmic contact layers DS: one of the Ohmic contact layers DS is interposed between the drain electrode DT and one of the two impurity regions; and the other one of the Ohmic contact layers DS is interposed between the source electrode ST and the other one of the two impurity regions. The two impurity regions are formed so as to be covered with each of the two Ohmic contact layers DS. Further, on each of the two Ohmic contact layers DS, the drain electrode DT and the source electrode ST each having a shape similar to that of each of the two Ohmic contact layers DS are formed so as to cover each of the two Ohmic contact layers DS. At this time, the drain electrode DT, the source electrode ST, and the two Ohmic contact layers DS extend from a part of the insulating film ES so as to cover the drain region DR or the source region SR. The drain region DR and the source region SR each have an upper surface and one of the side surfaces covered with one of the two Ohmic contact layers DS, to thereby contact with the one of the two Ohmic contact layers DS. In the manner as described above, when the region NR is divided into the two impurity regions, a region of the semiconductor film S existing in a region between the drain region DR and the source region SR is covered with the insulating film ES at the upper surface thereof and functions as a channel region. The drain region DR and the source region SR are formed at both ends of the semiconductor film S so as to sandwich the region functioning as a channel region.

Finally, silicon nitride is deposited as a passivation film PA by plasma CVD method on the entire structure formed as described above (FIG. 4J). The passivation film PA protects the thin-film transistor TFT formed as described above.

Figure 10:
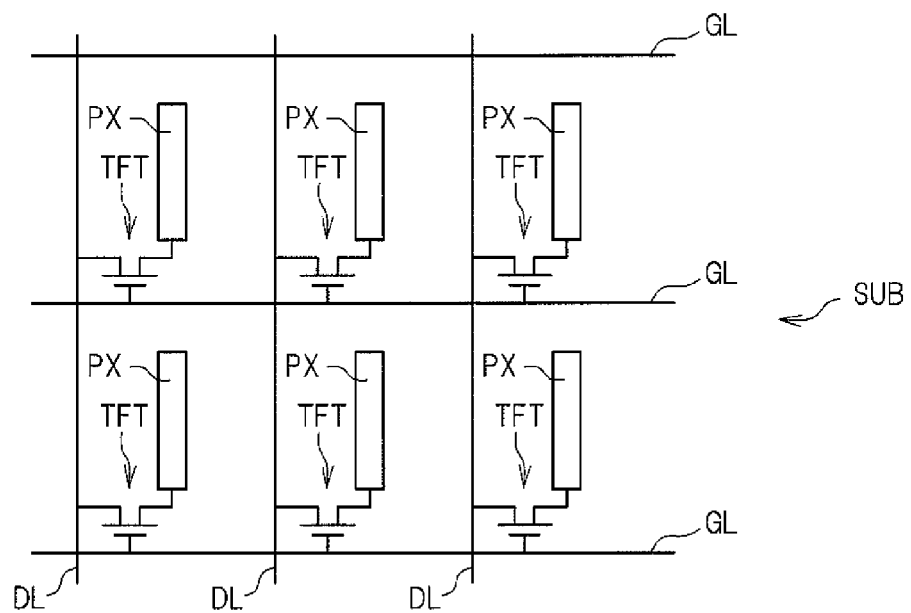
FIG. 10 is a diagram illustrating an example of an equivalent circuit diagram of a TFT substrate forming a display device employing VA system or TN system.
Figure 11:
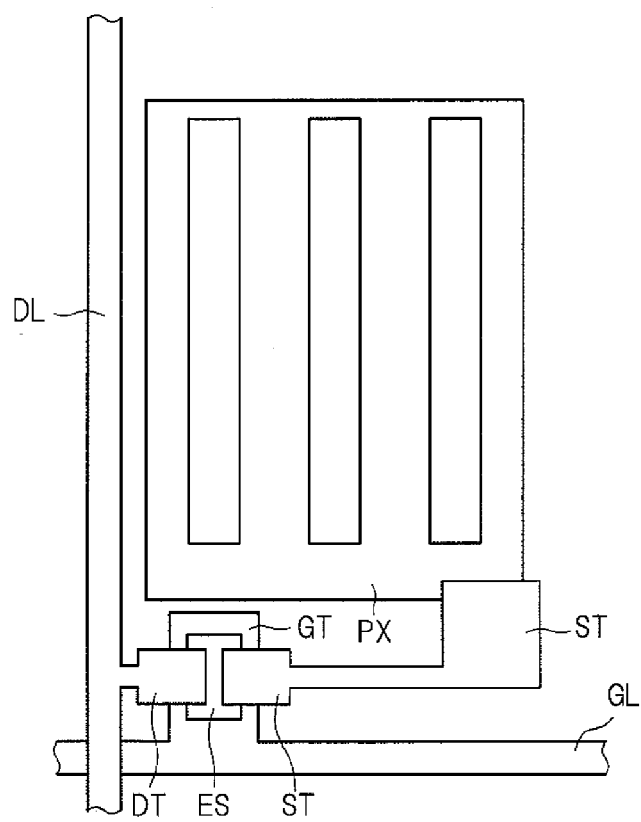
FIG. 11 is an enlarged plan view illustrating an example of a pixel region on the TFT substrate employing VA system or TN system.

It should be noted that, in the liquid crystal display device according to the embodiment of the present invention, a description is given of a case where IPS system is employed as a driving system of liquid crystals. However, the present invention may also be applied to any other driving systems, such as vertically aligned (VA) system and twisted nematic (TN) system. FIG. 10 is a diagram illustrating an equivalent circuit of a TFT substrate SUB forming a display device employing VA system or TN system, and FIG. 11 is an enlarged plan view illustrating a pixel region on the TFT substrate SUB of the display device employing one of those systems. In either case of VA system and TN system, instead of providing the counter electrodes CT and the common signal lines CL on the TFT substrate SUB, the counter electrodes CT are provided on a counter substrate which is provided with a color filter and opposed to the TFT substrate SUB.

It should be noted that a description is given of an embodiment in which the present invention is implemented as a liquid crystal display device. However, the present invention is not limited thereto, and may also be applied to any other display devices such as an organic electro luminescence (EL) device. It is obvious that the present invention may be appropriately modified without departing the gist of the technical idea in the embodiment described above.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a transparent substrate; and
   a thin-film transistor formed on the transparent substrate;
   wherein the thin-film transistor has a gate electrode, a gate insulating layer formed above the gate electrode, a semiconductor film including one of microcrystalline silicon and polycrystalline silicon being formed on the gate insulating layer, two Ohmic contact layers, a source electrode, and a drain electrode;
   wherein the semiconductor film includes a channel region and two impurity regions formed of regions which are doped with impurities on both sides of the channel region;
   wherein each of the channel region and the two Impurity regions has a surface in contact with the gate insulating layer and an upper surface which is opposite to the surface in contact with the gate insulating layer;
   wherein each of the two impurity regions has one side surface in contact with the channel region and another side surface which is opposite to the one side surface in contact with the channel region;
   wherein an insulating film is formed on the upper surface of the channel region;
   wherein the insulating film has a surface in contact with the channel region, an upper surface which is opposite to the surface in contact with the channel region, and side surfaces;
   wherein the two Ohmic contact layers are formed of layers different from a layer where the semiconductor film is formed;
   wherein each of the two Ohmic contact layers directly covers the upper surface and the another side surface of the impurity regions and is formed in contact with the upper surface and one of the side surfaces of the insulating film; and
   wherein the source electrode and the drain electrode are connected to the impurity regions through the Ohmic contact layers.

2. A display device according to claim 1,
   wherein the two Ohmic contact layers are formed of amorphous silicon which is doped with impurities; and
   wherein the two Ohmic contact layers are higher in impurity concentration than the two impurity regions.

3. A display device according to claim 1, wherein the source electrode and the drain electrode oppose each other on the upper surface of the insulating film.

4. A display device according to claim 1, wherein each of the two impurity regions of the semiconductor film which is formed in the layer of the semiconductor film has the one side surface in contact with the channel region and the another side surface which is not in contact with the channel region, the Ohmic contact layers which are formed of layers different from the layer of the impurity regions of the semiconductor film cover the another side surface of the impurity regions and the upper surface of the impurity regions.

5. A display device according to claim 1, wherein the semiconductor film is a planar film, and the layer where the semiconductor film is formed is a planar layer.

6. A display device according to claim 1, wherein each of the two Ohmic contact layers which cover the upper surface and the another side surface of the impurity regions extend so as to contact one of the side surfaces of the insulating film formed on the upper surface of the channel region and extend to contact with a portion of the upper surface of the insulating film.

\* \* \* \* \*